United States Patent [19]
Chen et al.

[11] Patent Number: 5,847,587
[45] Date of Patent: Dec. 8, 1998

[54] MEANS FOR INSTANTANEOUSLY DETECTING ABNORMAL VOLTAGE IN A MICRO CONTROLLER

[75] Inventors: Jason Chen, Ilan; Yi Lin, Tao Yuan; Kuo-Cheng Yu, Hsin-chu, all of Taiwan

[73] Assignee: Holtek Microelectronics Inc., Hsinchu, Taiwan

[21] Appl. No.: 779,430

[22] Filed: Jan. 7, 1997

[51] Int. Cl.$^6$ .................................................. H03K 17/22
[52] U.S. Cl. ............................... 327/143; 327/77; 327/80
[58] Field of Search ...................................... 327/142, 143, 327/198, 72, 74–81, 85, 88, 89, 20

[56] References Cited

U.S. PATENT DOCUMENTS

| | | | |
|---|---|---|---|
| 4,438,357 | 3/1984 | Wicnienski | 327/143 |
| 5,675,272 | 10/1997 | Chu | 327/142 |

FOREIGN PATENT DOCUMENTS

| | | | |
|---|---|---|---|
| 2-210912 | 8/1990 | Japan | 327/143 |
| 4-361423 | 12/1992 | Japan | 327/143 |

Primary Examiner—Timothy P. Callahan
Assistant Examiner—T. T. Lam
Attorney, Agent, or Firm—Bacon & Thomas

[57] ABSTRACT

A voltage detector circuit for instantaneously detecting abnormal voltages in a micro controller includes a voltage detection circuit connected between the power supply and reset voltage ends of an internal circuit of the micro controller so as to instantaneously detect changes in the power supply, without the time delay associated with the external low pass filter that supplies the reset voltage. The detecting circuit is a logic "NOT" gate which has a power supply connecting end connected to a reset voltage end of the internal circuit, an input end connected to the power supply end of the internal circuit, and an output end connected to a cooperating input end of the latch circuit, so that the latch circuit latches a signal output by the voltage detector whenever an abnormal power supply voltage is detected, and outputs a flag signal to the micro controller to effect an instantaneous reset of the micro controller. The latch may be a flip-flop, in which case one of the flip-flop inputs is connected to the voltage detector output and the other input may be connected together with the flip-flop power supply input to the reset voltage, the flip-flop providing two outputs, one of which may be connected to the micro controller reset pin, and the other of which may be connected to an interrupt or other indicator device.

6 Claims, 3 Drawing Sheets

5,847,587

MEANS FOR INSTANTANEOUSLY DETECTING ABNORMAL VOLTAGE IN A MICRO CONTROLLER

BACKGROUND OF THE INVENTION

1. Field of the Invention

The present invention relates to a means for instantaneously detecting abnormal voltage in a micro controller, and more particularly to a digital circuit for instantaneously detecting a voltage of a micro controller, so that instantaneous change of the voltage to a non-nominal rating can be detected and an abnormal voltage signal reflecting the change can be output as a basis for the micro controller to effect an instantaneous interruption or reset.

2. Description of the Prior Art

A conventional micro controller can operate normally only within a certain range of supply voltages. Once the supply voltages exceed the normal range, abnormal operation in of the micro controller will result. Hence, recent designs for protection against abnormal supply voltages that will cause improper operation of a micro controller have required reset of the micro controller when it encounters an abnormal supply voltage, until the supply voltage becomes normal again, after which, the micro controller must be re-started to work. Under this condition, it is necessary to provide voltage detecting means near the micro controller to screen the supply voltage.

In most voltage detectors, as shown in FIG. 1A, a voltage detector comprising an analog circuit is employed. However, in general micro controllers do not use such voltage detectors because the analog circuit structure is found not satisfactory for a system in which power-saving is a must. FIGS. 1B and 1C illustrate conventional voltage detecting means for micro controllers. As shown, the micro controller is provided with an external Reset pin for a user. Such a Reset pin requires an external circuit which includes an RC low pass filter structure. In international Patent Application laid open on Jul. 11, 1996 under number PCT WO 96/21158 discloses such a structure. In this design, only when the supply voltage drops for a considerably long time will the voltage at the Reset pin change with the supply voltage to generate a proper Reset signal. In the event the supply voltage quickly drops from a stable state and then quickly comes up again, such instantaneous change will still result in abnormal operation or even failure of the micro controller. In brief, the conventional voltage detecting means as shown in FIGS. 1B and 1C can not detect the instantaneous abnormal voltage and can be used to detect a voltage change and issue a Reset signal only when the voltage change last for a maximum time interval. This is, of course, not an ideal structure.

The inventor has therefore developed a means for instantaneously detecting abnormal voltage in a micro controller to eliminate the drawbacks existed in the conventional means for similar purpose.

SUMMARY OF THE INVENTION

A primary object of the present invention is to provide a means for instantaneously detecting abnormal voltage in a micro controller. The means includes a detecting circuit connected between the micro controller's voltage power supply but and the external Reset pin, and a latch connected to the detecting circuit so as to instantaneously detect and latch changes in the voltage power supply, without the time delay associated with the external low pass filter circuit.

Moreover, in the present invention a digital detecting circuit is used to replace the conventional analog detecting circuit and therefore reduces power consumption at the Reset pin and shortens the time interval of voltage change required by the detector.

BRIEF DESCRIPTION OF THE DRAWINGS

The detailed structure, the applied principle, and the function and performance of the present invention can be best understood by referring to the following detailed description of the preferred embodiment and the accompanying drawings, wherein.

DETAILED DESCRIPTION OF THE PREFERRED EMBODIMENT

Figure 1A:
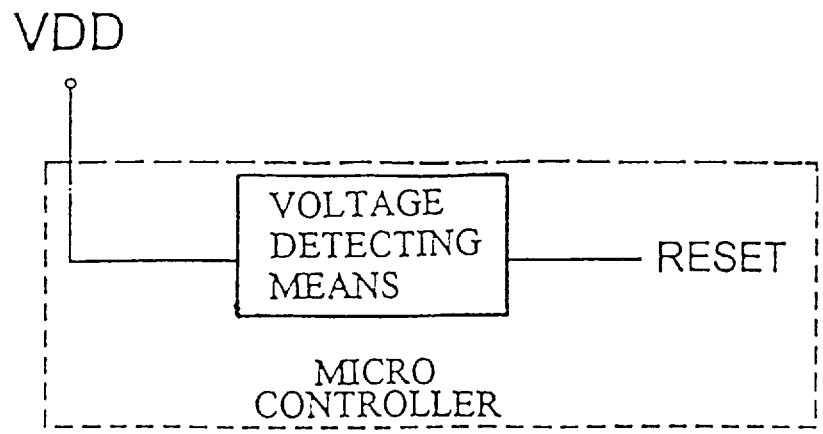
FIG. 1A shows a conventional voltage detector including an analog circuit.
Figure 1B:
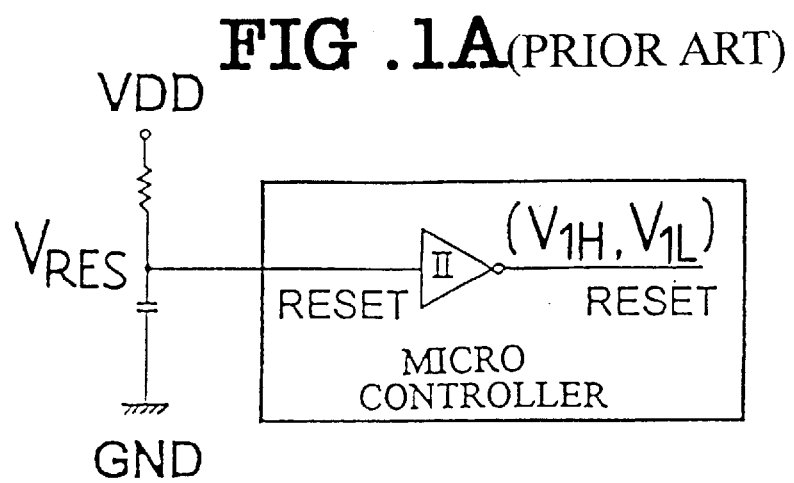
FIG. 1B shows a conventional means for detecting abnormal voltage in a micro controller.
Figure 1C:
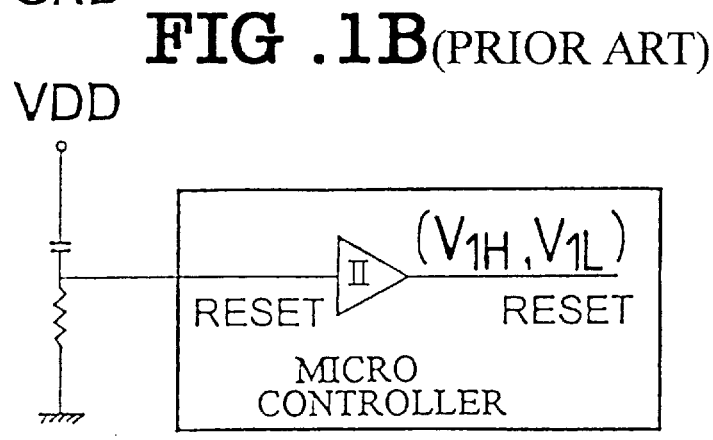
FIG. 1C shows another conventional means for detecting abnormal voltage in a micro controller.
Figure 2:
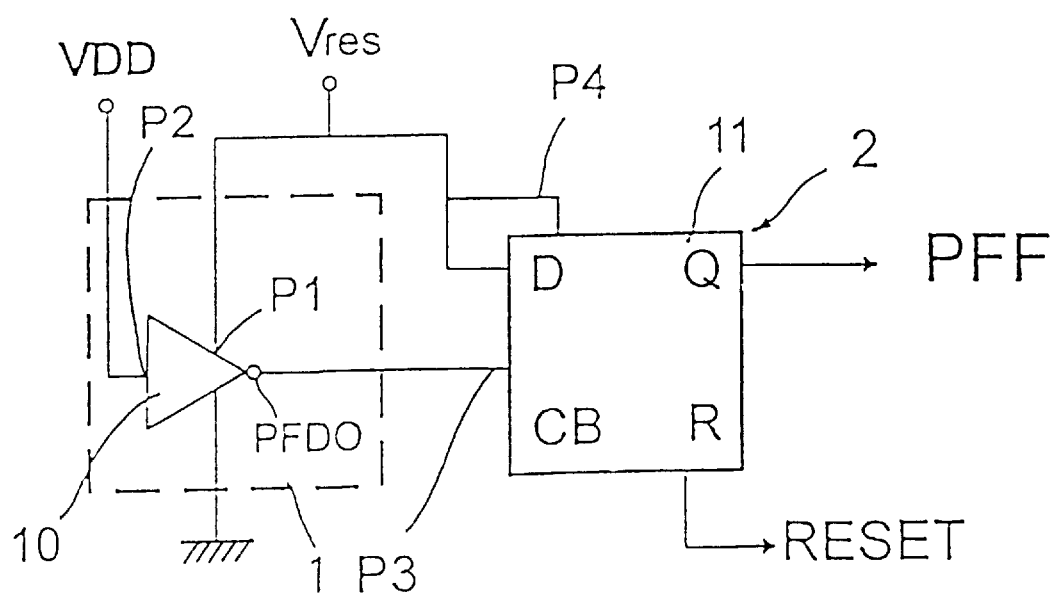
FIG. 2 is a logic circuit diagram of the means according to the present invention.

The present invention relates to a means for instantaneously detecting abnormal voltage in a micro controller. Please refer to FIG. 2 in which a logic circuit of the means according to the present invention is shown. As shown, the means includes a detecting circuit 1 for setting a voltage value to be detected and a latch circuit 2. The detecting circuit 1 has a logic "NOT" gate 10 which is preferably a CMOS. This logic "NOT" gate 10 has a power supply connecting end P1 leading to a reset voltage end (Vres) of an internal circuit of a micro controller, and an input end P2 connected to a power supply end (VDD) of the internal circuit of the micro controller. The logic "NOT" gate 10 also has an output end (PFDO) connected to a cooperating input end P3 of the latch circuit 2. The latch circuit 2 may be a flip-flop or a latch which is functionally equivalent to a flip-flop. As shown in the figure, when a flip-flop 11 is used as the latch circuit 2, a CB end of the flip-flop 11 is connected to the output end (PFDO) of the logic "NOT" gate 10, and a D end and a power supply connecting end P4 thereof are together connected to the reset voltage end (Vres) of the internal circuit of the above-mentioned micro controller. Output ends Q and R of the latch circuit 2 can output flag signals (PFF) reflecting a detected abnormal voltage. These flag signals (PFF) may be led to a reset circuit (reset $\mu$ c), or be used to trigger an interruption, or be provided to a user only for his or her use and judgement of the abnormal condition. Hence, whenever there is an instantaneous change of the micro controller's voltage to a non-nominal rating, it can be instantaneously detected and be latched by a signal, causing the flag signal (PFF) at the output ends of the latch circuit 2 to issue an abnormal voltage signal for the micro controller to effect an interruption or to reset.

A detecting potential of the detecting circuit 1 can be set through a mask option to meet requirements of the entire system in which the means of the present invention is incorporated, so that applications of the means of the present invention can meet various needs.

Figure 3:
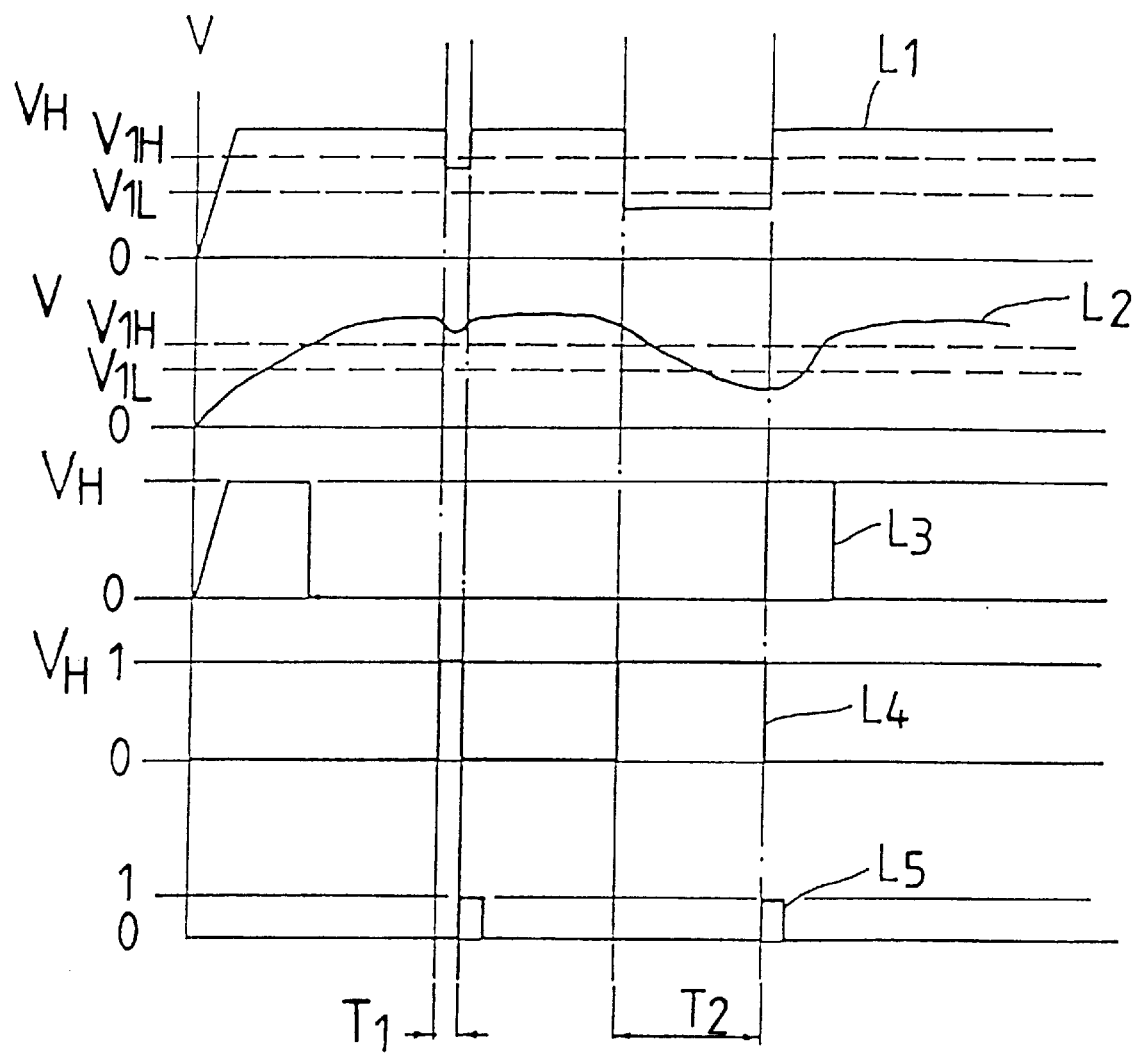
FIG. 3 is a graph showing the abnormal voltage detected by the means of the present invention.

FIG. 3 is a graph illustrating how the means of the present invention functions when an abnormal voltage is present in the micro controller. In the drawing, broken line L1 is a voltage/time broken line obtained at the above-mentioned power supply end (VDD), curve L2 is a voltage/time curve obtained at the above-mentioned reset voltage end (Vres), broken line L3 is a voltage/time broken line obtained at the above-mentioned RESET output end, broken line L4 is a voltage/time broken line obtained at the power failure detector output (PFDO) end of the above-mentioned logic "NOT" gate 10, and broken line L5 is a voltage/time broken line obtained at the above-mentioned flag signal (PFF) output end. As shown, an instantaneous and a long voltage drop present at both the power supply end (VDD) and the reset voltage end (Vres) in time periods T1 and T2, respectively. Unlike the conventional abnormal voltage detecting means, the present invention can, at both the Power Failure Detector Output (PFDO) end and the flag signal (PFF) output end, detect even very minor voltage drops presented in the very short time period T1. Numeral 1 is used to indicate a high potential representing of abnormal condition message output that causes basis to have the micro controller to be interrupted or reset.

From the above description, it can be seen that the means of the present invention indeed has the ability to instantaneously detect abnormal voltages in a micro controller through a digital circuit, and thereby allows the micro controller to effect an instantaneous interrupt or reset, which is difficult to accomplish during the conventional abnormal voltage detecting means.

Although the present invention has been described with the preferred embodiments thereof, it should be noted that the present invention is not limited to such embodiments and various changes can be made without departing from the spirit of the present invention or the scope of the subjoined claims.

What is claimed is:

1. A detector for instantaneously detecting an abnormal voltage in a micro controller having an internal circuit, said internal circuit having a power supply end and a reset voltage end, comprising:

a detecting circuit arranged to detect a voltage value at said power supply end of said internal circuit; and a latch circuit having an input end and an output end, wherein said detecting circuit is a logic "NOT" gate which includes:

a power supply connecting end connected to the reset voltage end of the internal circuit;

an input end connected to the power supply end of the internal circuit; and an output end connected to said input end of said latch circuit;

wherein whenever a non-nominal change in said voltage value occurs, said detecting circuit outputs a signal which is latched by the latch circuit, and as a result said output end of said latch circuit outputs a flag signal reflecting the abnormal voltage in said micro controller.

2. A detector for instantaneously detecting an abnormal voltage in a micro controller as claimed in claim 1, wherein said detecting circuit is a CMOS logic "NOT" gate.

3. A detector for instantaneously detecting an abnormal voltage in a micro controller as claimed in claim 1 or 2, wherein said latch circuit is a flip-flop having input and output ends corresponding to said input and output ends of the latch circuit.

4. A detector for instantaneously detecting an abnormal voltage in a micro controller as claimed in claim 1 or 2, wherein said latch circuit includes means for performing a function of a flip-flop.

5. A detector for instantaneously detecting an abnormal voltage in a micro controller as claimed in claim 3, wherein said input end of said flip-flop is a CB end connected to the output end of said logic "NOT" gate, said flip-flop further includes a D end and a power supply connecting end together connected to said reset voltage end of said micro controller, and said output end of the flip-flop includes a Q output end and an R output end for outputting said flag signals reflecting said abnormal voltage.

6. A detector for instantaneously detecting an abnormal voltage in a micro controller as claimed in claim 3, wherein said detecting circuit has a detecting potential which can be set through mask option to meet requirements of an entire system in which said detector and said micro controller are incorporated.

* * * * *